United States Patent
Liu et al.

(10) Patent No.: US 9,466,581 B2
(45) Date of Patent: Oct. 11, 2016

(54) SEMICONDUCTOR PACKAGE DEVICE AND MANUFACTURING METHOD THEREOF

(71) Applicant: TAIWAN SEMICONDUCTOR MANUFACTURING COMPANY LTD., Hsinchu (TW)

(72) Inventors: Nai-Wei Liu, Kaohsiung County (TW); Jui-Pin Hung, Hsinchu (TW); Jing-Cheng Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/057,539

(22) Filed: Oct. 18, 2013

(65) Prior Publication Data

US 2015/0108634 A1  Apr. 23, 2015

(51) Int. Cl.
*H01L 23/31* (2006.01)
*H01L 23/00* (2006.01)
(Continued)

(52) U.S. Cl.
CPC ............ *H01L 24/13* (2013.01); *H01L 23/3114* (2013.01); *H01L 23/3171* (2013.01); *H01L 23/5389* (2013.01); *H01L 24/10* (2013.01); *H01L 24/11* (2013.01); *H01L 24/18* (2013.01); *H01L 24/19* (2013.01); *H01L 24/96* (2013.01); *H01L 23/3128* (2013.01); *H01L 23/49816* (2013.01); *H01L 2224/19* (2013.01);
(Continued)

(58) Field of Classification Search
CPC .......... H01L 2224/16237; H01L 2224/16238; H01L 2224/1624; H01L 2224/16257; H01L 2224/1626; H01L 2224/16267; H01L 23/3128; H01L 23/3171; H01L 24/10
See application file for complete search history.

(56) References Cited

U.S. PATENT DOCUMENTS 6,326,701 B1 * 12/2001 Shinogi et al. ............... 257/797
2004/0159933 A1 * 8/2004 Sunohara et al. ............ 257/700
(Continued)

FOREIGN PATENT DOCUMENTS

JP      2009521127 A      5/2009

OTHER PUBLICATIONS

Office action of the corresponding Taiwanese application 103116347 dated Jul. 9, 2015.
(Continued)

*Primary Examiner* — Phat X Cao
(74) *Attorney, Agent, or Firm* — WPAT, P.C., Intellectual Property Attorneys; Anthony King

(57) ABSTRACT

A semiconductor device includes a die, a pad disposed on the die and configured to be electrically coupled with a bump through a conductive trace attached on the pad, a polymer disposed over the die and patterned to provide a path for the conductive trace passing through, and a molding surrounding the die and the polymer. A top surface of the molding is substantially in a same level as a top surface of the polymer. Further, a method of manufacturing a semiconductor device includes providing a die, forming a pad on the die, disposing a first polymer over the die, patterning the first polymer with an opening over the pad, disposing a sacrificial layer over the patterned first polymer, disposing a molding surrounding the die, removing a portion of the molding thereby exposing the sacrificial layer, removing the sacrificial layer thereby exposing the pad and the first polymer, disposing a second polymer on the first polymer, patterning the second polymer with the opening over the pad, and disposing a conductive material on the pad within the opening.

19 Claims, 19 Drawing Sheets

(51) Int. Cl.
  *H01L 23/538* (2006.01)
  *H01L 23/498* (2006.01)
(52) U.S. Cl.
  CPC ............... *H01L2924/12042* (2013.01); *H01L 2924/181* (2013.01)

(56) References Cited

U.S. PATENT DOCUMENTS

2009/0227091 A1  9/2009  Sonsky et al.
2011/0221041 A1  9/2011  Lin et al.
2013/0087916 A1  4/2013  Lin et al.
2013/0113094 A1* 5/2013  Wu et al. ...................... 257/737
2013/0264684 A1  10/2013  Yu et al.

OTHER PUBLICATIONS

English abstract translation of the Office action of the corresponding Taiwanese application 103116347 dated Jul. 9, 2015.
Notice of Allowance of the corresponding Korean application 10-2014-0139885 from Korean Intellectual Property office dated Jan. 27, 2016.
English abstract translation of the Notice of Allowance of the corresponding Korean application 10-2014-0139885 from Korean Intellectual Property office dated Jan. 27, 2016.
JP2009521127 corresponds to US20090227091.

* cited by examiner

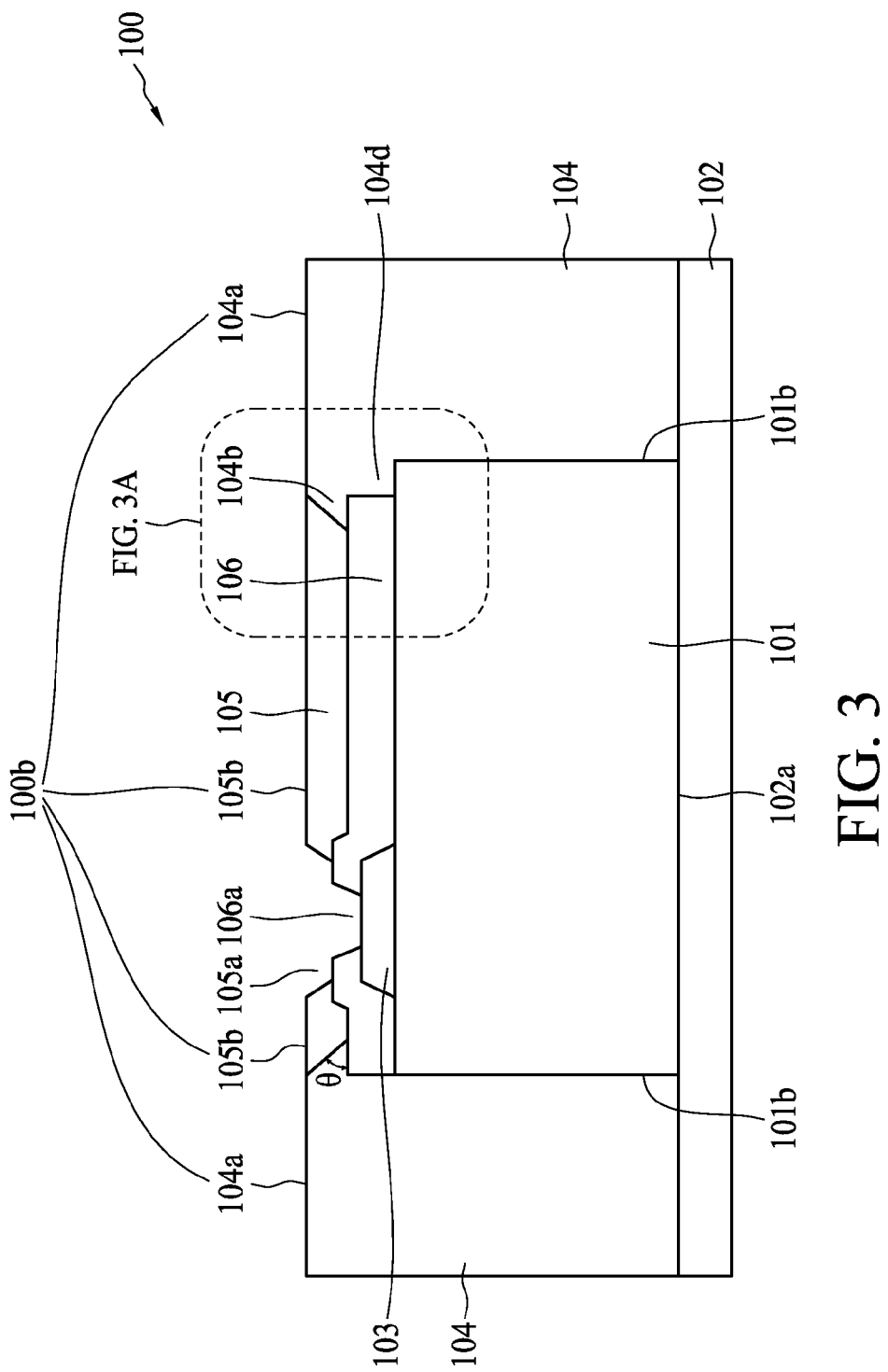

SEMICONDUCTOR PACKAGE DEVICE AND MANUFACTURING METHOD THEREOF

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipment includes more and more steps of assembly and processing as well as materials for producing the semiconductor devices in the electronic equipments. Therefore, there is a continuous demand on simplifying the steps of production, increasing a production efficiency and lowering an associated manufacturing cost on each electronic equipment.

During the operations of manufacturing the semiconductor device, the semiconductor device is assembled with numbers of integrated components including various materials with difference in thermal properties. As such, the integrated components are in undesired configurations after curing of the semiconductor device. The undesired configurations would lead to yield loss of the semiconductor device, poor bondability between the components or delamination of the components, etc. Furthermore, the components of the semiconductor device includes various metallic materials which are in limited quantity and thus in a high cost. The undesired configurations of the components and the yield loss of the semiconductor would further exacerbate materials wastage and thus the manufacturing cost would increase.

As more different components with different materials are involved and a complexity of the manufacturing operations of the semiconductor device is increased, there are more challenges to simplify the manufacturing operations and minimize materials usage. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is a schematic view of a semiconductor device with a protruded portion of a molding in accordance with some embodiments of the present disclosure.

DETAILED DESCRIPTION OF THE INVENTION

Figure 1:
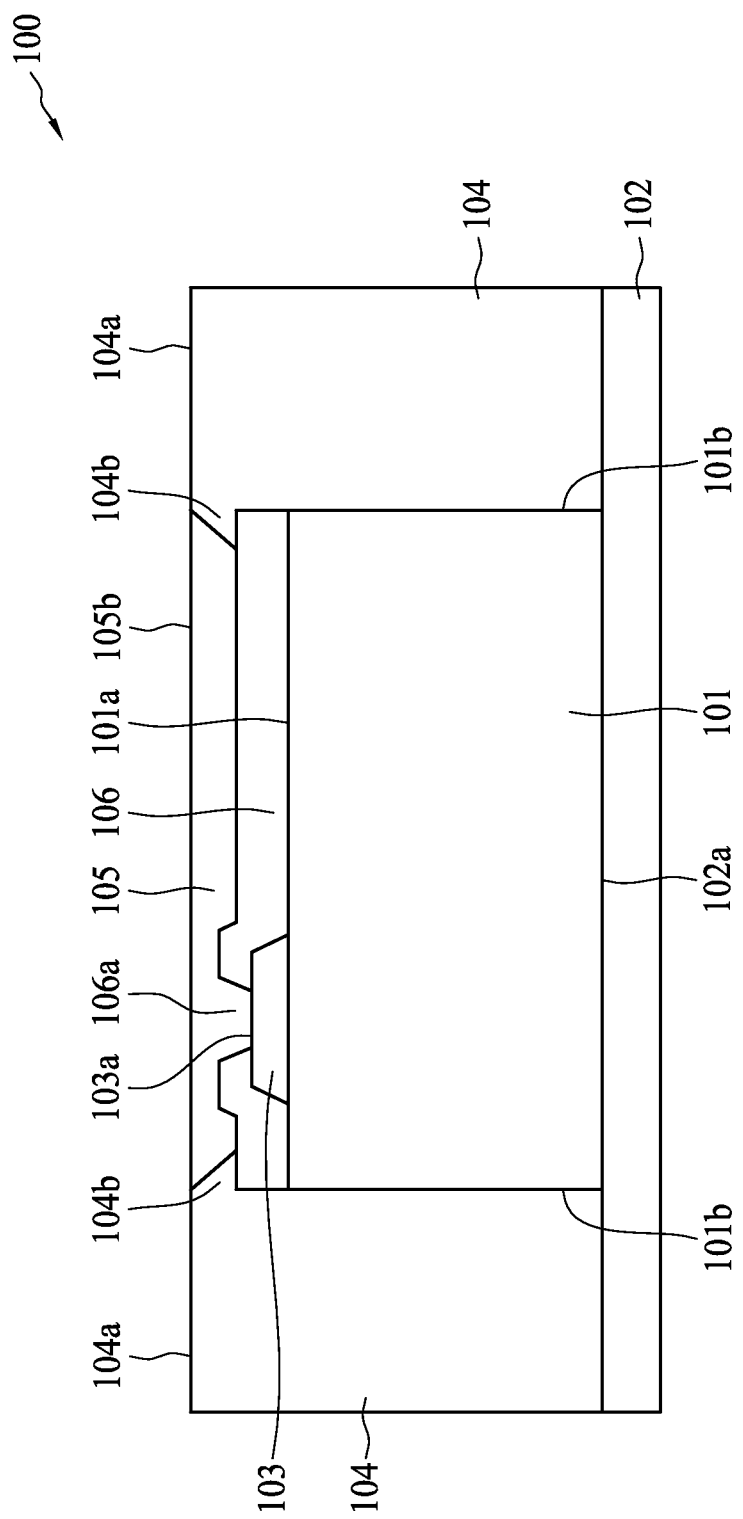
FIG. 1 is a schematic view of a semiconductor device in accordance with some embodiments of the present disclosure.

A semiconductor device is manufactured by a number of operations. During the manufacturing, a circuitry of a die is connected with an external circuitry through a conductive trace, so that the die is electrically connected with the external circuitry from a pad on the die to a bump such as solder bump or solder ball for receiving a pad of the external circuitry. In order to facilitate a configuration of the conductive trace within the semiconductor device, a copper pillar is disposed within the conductive trace adjacent to the surface of the pad of the die. However, material cost of copper is high and thus manufacturing cost of the semiconductor device is increased.

Further, the die is protected by a molding compound. The molding compound encloses and isolates the die from the surrounding environment. Upon disposing the molding compound around the die, a stepped portion of the molding is formed adjacent to an edge of the die. The stepped portion would cause other components subsequently placed over the die could not be smoothly disposed thereon, and thus delamination of components is suffered. The formation of the stepped portion of the molding compound leads to a stepping between components and thus induce a poor reliability of the semiconductor device.

In the present disclosure, a semiconductor device with a structural improvement is disclosed. The semiconductor device includes an additional polymer disposed over a die and surrounded by a molding in order to compensate a stepping of the molding adjacent to an edge of the die and improve a smoothness of a top surface of the molding for disposing the components thereon, and thus prevent delamination of components and improve a reliability of the semiconductor device.

The manufacturing and use of the embodiments of the present invention are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is an embodiment of a semiconductor device 100. The semiconductor device 100 includes a die 101 disposed on a carrier 102. The die 101 includes a pad 103 disposed on a surface 101a of the die 101. A polymer 105 is disposed over the die 101. The die 101 and the polymer 105 are surrounded by a molding 104.

In some embodiments, the carrier 102 is a silicon wafer which would be fabricated to become integrated circuits (IC) in subsequent manufacturing operations. In some embodiments, the carrier 102 is a circuit board including some circuits for electrical connection of components thereon. In some embodiments, the circuit board is a printed circuit board (PCB). In some embodiments, the carrier 102 is in a circular shape.

In some embodiments, the die 101 is a small piece including semiconductor materials such as silicon and is fabricated with a predetermined functional circuit within the die 101 produced by photolithography operations. In some embodiments, the die 101 is singulated from a silicon wafer by a mechanical or laser blade and then is placed on the carrier 102 for subsequent manufacturing operations. In some embodiments, the die 101 is attached on the surface 102a of the carrier 102 by an adhesive, a tape or die attach film (DAF) etc. In some embodiments, the die 101 is in a quadrilateral, a rectangular or a square shape.

In some embodiments, the pad 103 is a bond pad disposed on the surface 101a of the die 101 as in FIG. 1. In some embodiments, the pad 103 is electrically connected with a circuitry external to the die 101, so that a circuitry internal to the die electrically connects with the circuitry external to the die 101 through the pad 103. In some embodiments, the pad 103 is configured for electrically coupling with a bump through a conductive trace attached on the pad 103, so that the circuitry internal to the die 101 connects with the circuitry external to the die 101 from the pad 103 to the bump through the conductive trace. In some embodiments, the bump is a solder bump, solder ball, solder paste or etc. In some embodiments, the pad 103 includes gold, silver, copper, nickel, tungsten, aluminum, palladium and/or alloys thereof.

In some embodiments, the die 101 includes a passivation 106 on the surface 101a of the die 101 as in FIG. 1. The passivation 106 surrounds the pad 103. In some embodiments, the passivation 106 covers a portion of the pad 103. The passivation 106 is configured for providing an electrical insulation and a moisture protection for the die 101, so that the die is isolated from ambient environment. In some embodiments, the passivation 106 is formed with dielectric materials such as spin-on glass (SOG), silicon oxide, silicon oxynitride, silicon nitride or the like. In some embodiments, the passivation 106 is formed with a vapor deposition or a spin coating process.

In some embodiments as in FIG. 1, the passivation 106 includes an opening 106a above the pad 103 for exposing a portion of the pad 103 and thus for electrically connecting the pad 103 with the circuitry external to the die 101 through the conductive trace.

In some embodiments as in FIG. 1, the polymer 105 is disposed over the die 101 and is patterned to provide a path for the conductive trace passing through. In some embodiments, the polymer 105 is disposed over the passivation 106 and the pad 103 to cover the die 101. In some embodiments, the polymer 105 includes a polymeric material such as epoxy, polyimide, polybenzoxazole (PBO), solder resist (SR), ABF film, and the like.

Figure 2:
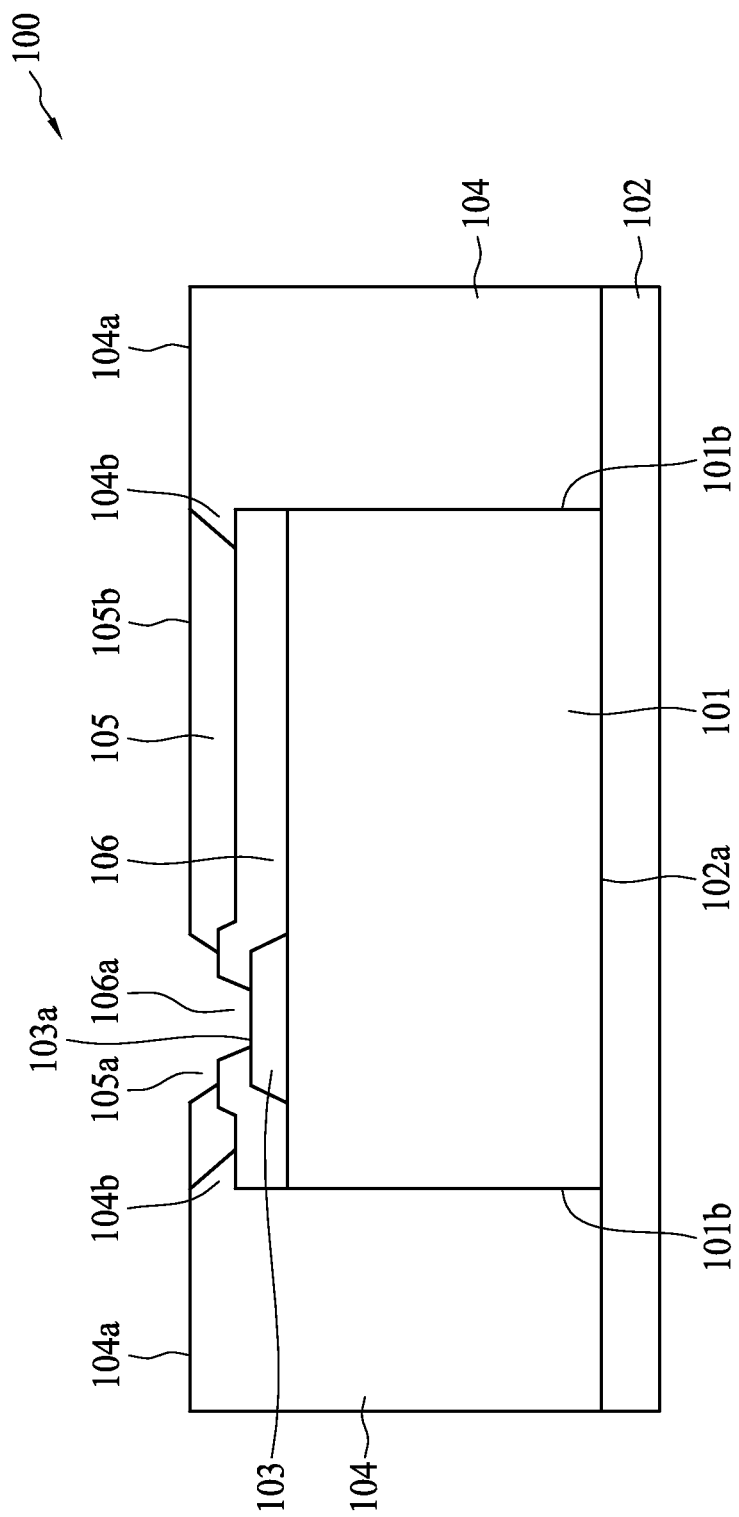
FIG. 2 is a schematic view of a semiconductor device with a first recessed portion of a first polymer in accordance with some embodiments of the present disclosure.

In some embodiments as in FIG. 2, the polymer 105 is patterned by several operations to form a recessed portion 105a. In some embodiments, the polymer 105 is patterned by photolithography, that a photoresist material is disposed on the polymer 105 to cover the polymer 105, and the photoresist material is partially exposed through a photomask in order to etch away some polymer 105 above the pad 103, so that the polymer 105 includes the recessed portion 105a.

A term "patterning" or "patterned" is used in the present disclosure to describe an operation of forming a predetermined pattern on a surface. The patterning operation includes various steps and processes and varies in accordance with the features of embodiments. In some embodiments, a patterning operation is adopted to pattern an existing film or layer. The patterning operation includes forming a mask on the existing film or layer and removing the unmasked film or layer with an etch or other removal process. The mask is a photo resist, or a hardmask. In some embodiments, a patterning operation is adopted to form a patterned layer directly on a surface. The patterning operation includes forming a photosensitive film on the surface, conducting a photolithography process and a developing process. The remaining photosensitive film is retained and integrated into the semiconductor device.

In some embodiments as in FIG. 2, the patterned polymer 105 includes the recessed portion 105a which is disposed above the pad. In some embodiments, the recessed portion 105a is disposed above the opening 106a of the passivation 106. The opening 106a of the passivation 106 is within the recessed portion 105a of the polymer 105. In some embodiments, the recessed portion 105a is larger than the opening 106a. In some embodiments, the recessed portion 105a and the opening 106a are configured for receiving a portion of a conductive trace disposed above the polymer 105. The pad 103 is electrically connected with the circuitry external to the die 101 through the conductive trace by passing through the recessed portion 105a and the opening 106a.

In some embodiments as in FIG. 3, the molding 104 surrounds the die 101 and the polymer 105. The molding 104 is disposed adjacent to a sidewall 101b of the die 101. In some embodiments, the molding 104 includes a protruded portion 104b extending into the polymer 105 adjacent to an edge of the die 101. The protruded portion 104b of the molding 104 is coupled with the polymer 105 and the passivation 106. The protruded portion 104b stands on the edge of the die 101. In some embodiments, the protruded portion 104b is in a stepped configuration.

Figure 3A:
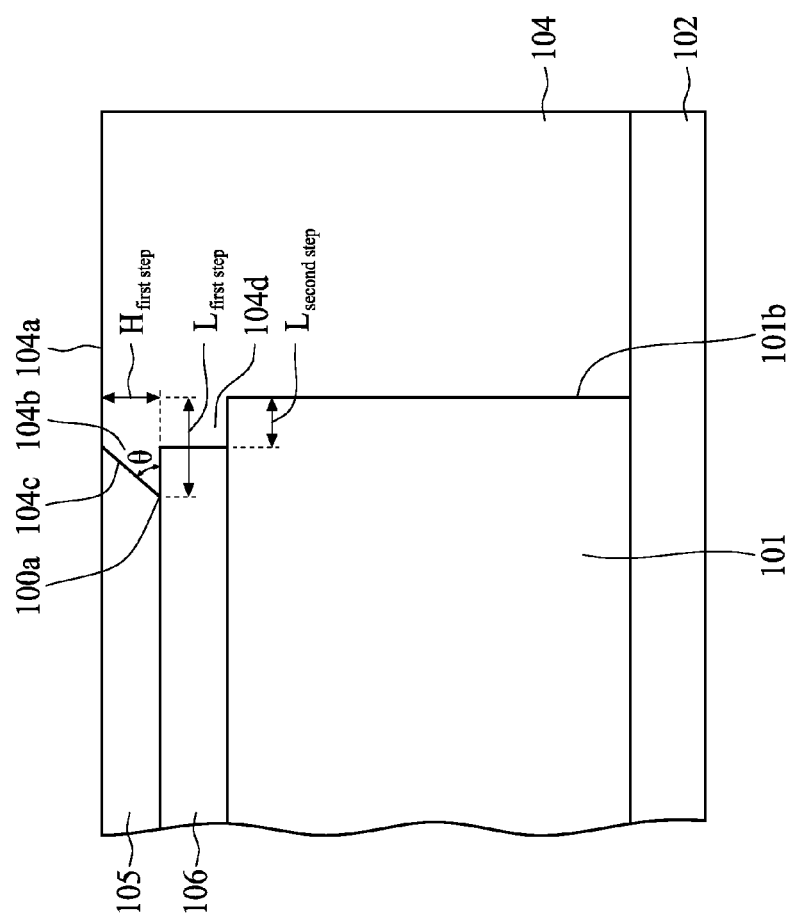
FIG. 3A is an enlarged view of a protruded portion and an extended portion of a molding in accordance with some embodiments of the present disclosure.

In some embodiments as in FIG. 3A, the protruded portion 104b has a height $H_{first\ step}$ running from a top surface 104a of the molding 104 to an interface between the molding 104 and the passivation 106. The height $H_{first\ step}$ is substantially the same as a thickness of the polymer 105. In some embodiments, the height $H_{first\ step}$ is about 1 um to about 15 um. In some embodiments, the height $H_{first\ step}$ is about 0.5 um to about 20 um.

In some embodiments, the protruded portion 104b has a length $L_{first\ step}$ which is a shortest straight distance between the sidewall 101b of the die 101 and a point 100a intersecting with the protruded portion 104b, the polymer 105 and the passivation 106. In some embodiments, the length $L_{first\ step}$ is extended from the edge of the die 101 towards the polymer 105. In some embodiments, the length $L_{first\ step}$ is about 5 um to about 15 um. In some embodiments, the length $L_{first\ step}$ is about 1 um to about 20 um.

In some embodiments, the molding 104 includes an angled interface 104c between the polymer 105 and the protruded portion 104b of the molding 104. In some embodiments, the angled interface 104c is in a tilted or tapered configuration. There is an angle θ between the angled interface 104c and passivation 106. In some embodiments, the angle θ is about 30 degrees to about 110 degrees. In some embodiments, the angle θ is about 10 degrees to about 130 degrees. In some embodiments, a portion of the polymer 105 overlays a portion of the molding 104 adjacent to the edge of the die 101 when the angle θ is less than about 90 degrees as in FIG. 3. In some embodiments, a portion of the molding 104 overlays a portion of the polymer 105 adjacent to the edge of the die 101 when the angle θ is greater than about 90 degrees.

In some embodiments, the molding 104 includes an extended portion 104d adjacent to the edge of the die 101. The extended portion 104d is extended from the edge of the die 101 towards the passivation 106.

In some embodiments as in FIG. 3A, the extended portion 104d has a length $L_{second\ step}$ extending from the sidewall 101b of the die 101 to the passivation 106. In some embodiments, the length $L_{second\ step}$ of the extended portion 104d is about 2 um to about 6 um. In some embodiments, the length $L_{second\ step}$ is about 1 um to about 10 um. In some embodiments, the extended portion 104d is in a stepped configuration.

In some embodiments, the molding 104 includes a molding compound. The molding compound can be a single layer film or a composite stack. The molding compound includes various materials, for example, one or more of epoxy resins, phenolic hardeners, silicas, catalysts, pigments, mold release agents, and the like. Each of the materials for forming a molding compound has a high thermal conductivity, a low moisture absorption rate, a high flexural strength at board-mounting temperatures, or a combination of these.

In some embodiments as in FIG. 3, a top surface 104a of the molding 104 is substantially in a same level as a top surface 105b of the polymer 105. The top surface 104a of the molding 104 and the top surface 105b of the polymer 105 are in cooperation to configure as a first flat interface 100b for receiving other components or materials of the semiconductor device 100 such as polymeric materials, dielectric materials, conductive materials, or etc. In some embodiments, the first flat interface 100b is a horizontally flattened surface which is absent from any stepping, stagger or tilting. The first flat interface 100b runs along a horizontal plane from one side of the semiconductor device to another opposite side of the semiconductor device 100.

As in FIG. 3, the polymer 105 disposed over the die 101 compensates a stepping between the die 101 and the molding 104, so that the first flat interface 100b is configured on top of the semiconductor device 100 for subsequently disposing other components or materials thereon. Such a flat interface configuration by disposition of the polymer 105 between the stepping of the die 101 and the molding 104 improves the smoothness of the top of the semiconductor device 100 and thus prevent delamination of components or materials.

Figure 4:
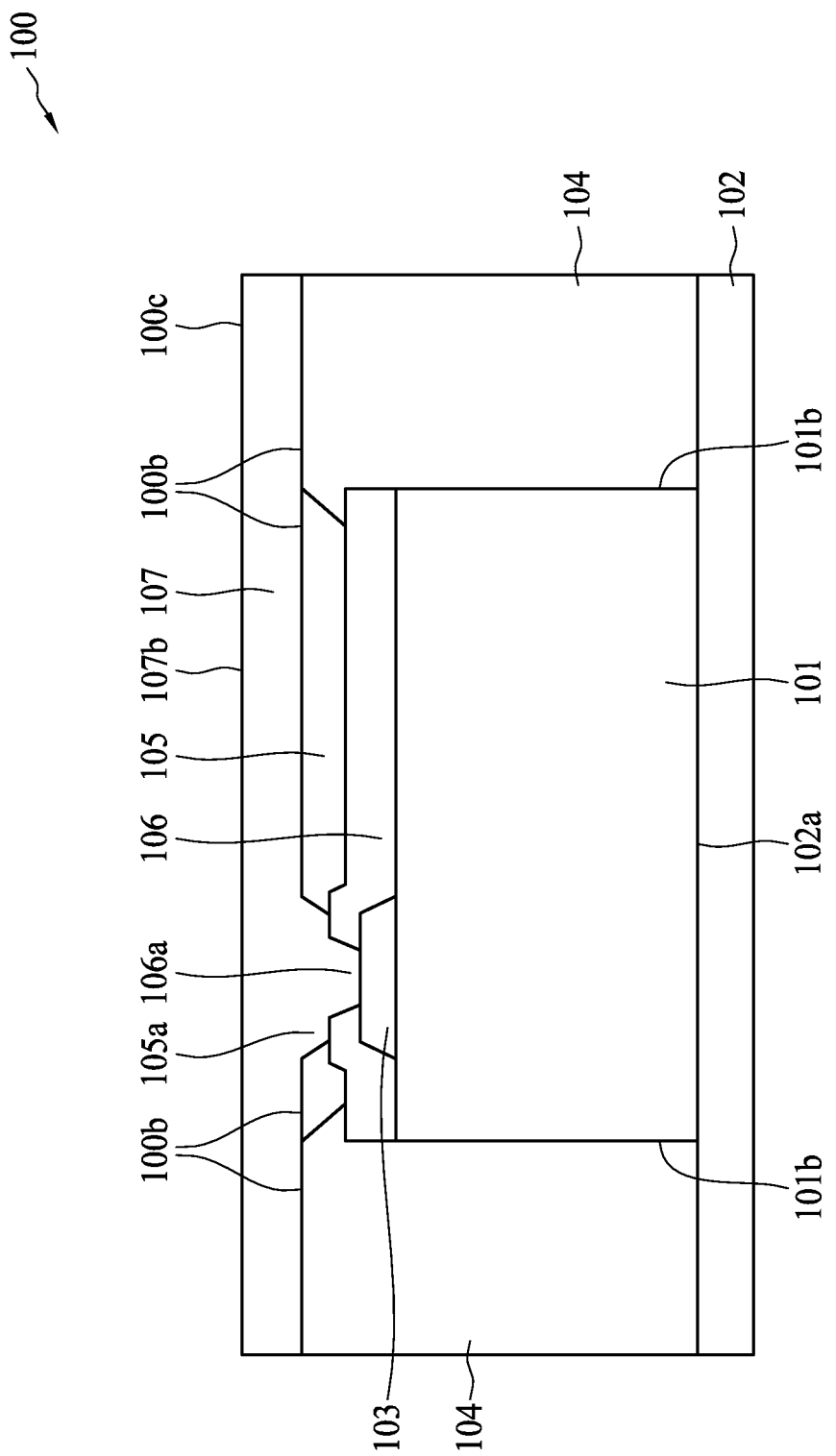
FIG. 4 is a schematic view of a semiconductor device with a second polymer in accordance with some embodiments of the present disclosure.

FIG. 4 is an embodiment of a semiconductor device 100. The semiconductor device 100 includes a die 101, a pad 103, a first polymer 105, a molding 104 and a second polymer 107. The pad 103 is disposed on the die 101 and electrically coupled with a bump through a conductive material attached on the pad 103. The first polymer 105 is disposed over the die 101 and is patterned to provide a path for the conductive material passing through. The molding 104 surrounds the die 101 and the first polymer 105. The second polymer 107 is disposed on the first polymer 105 and the molding 104. The configuration of the die 101, the pad 103, the first polymer 105 and the molding 104 are with reference to FIGS. 1, 2 and 3.

In some embodiments, the first polymer 105 includes a first recessed portion 105a above the pad 103. The first recessed portion 105a is configured for the conductive trace passing through in order to electrically connect the pad 103 with the circuitry external to the die 101.

In some embodiments, the second polymer 107 is disposed on the first polymer 105 and the molding along the first flat interface 100b to cover the die 101. The second polymer 107 runs horizontally from one side of the semiconductor device 100 to another opposite side of the semiconductor device 100 along the first flat interface 100b in absence of stepping, stagger or tilting as in FIG. 4. In some embodiments, the second polymer 107 is configured with a second flat interface 100c substantially parallel to the first flat interface 100b. The second flat interface 100c is configured for receiving other components or materials of the semiconductor device 100 such as polymeric materials, dielectric materials, conductive materials, or etc. In some embodiments, the second flat interface 100c is a horizontally flattened surface which is absent from any stepping, stagger or tilting.

In some embodiments, some of the second polymer 107 is disposed within the first recessed portion 105a adjacent to the pad 103. Some of the second polymer 107 in first recessed portion 105a and opening 106a is surrounded by first polymer 105 and passivation 106. In some embodiments, the second polymer 107 includes a polymeric material such as epoxy, polyimide, polybenzoxazole (PBO), solder resist (SR), ABF film, and the like. In some embodiments, the first polymer 105 includes different materials from the second polymer 107. In some embodiments, the second polymer 107 has a lower curing temperature than the first polymer 105. In other words, the first polymer 105 is able to sustain under a higher temperature than the second polymer 107.

Figure 5:
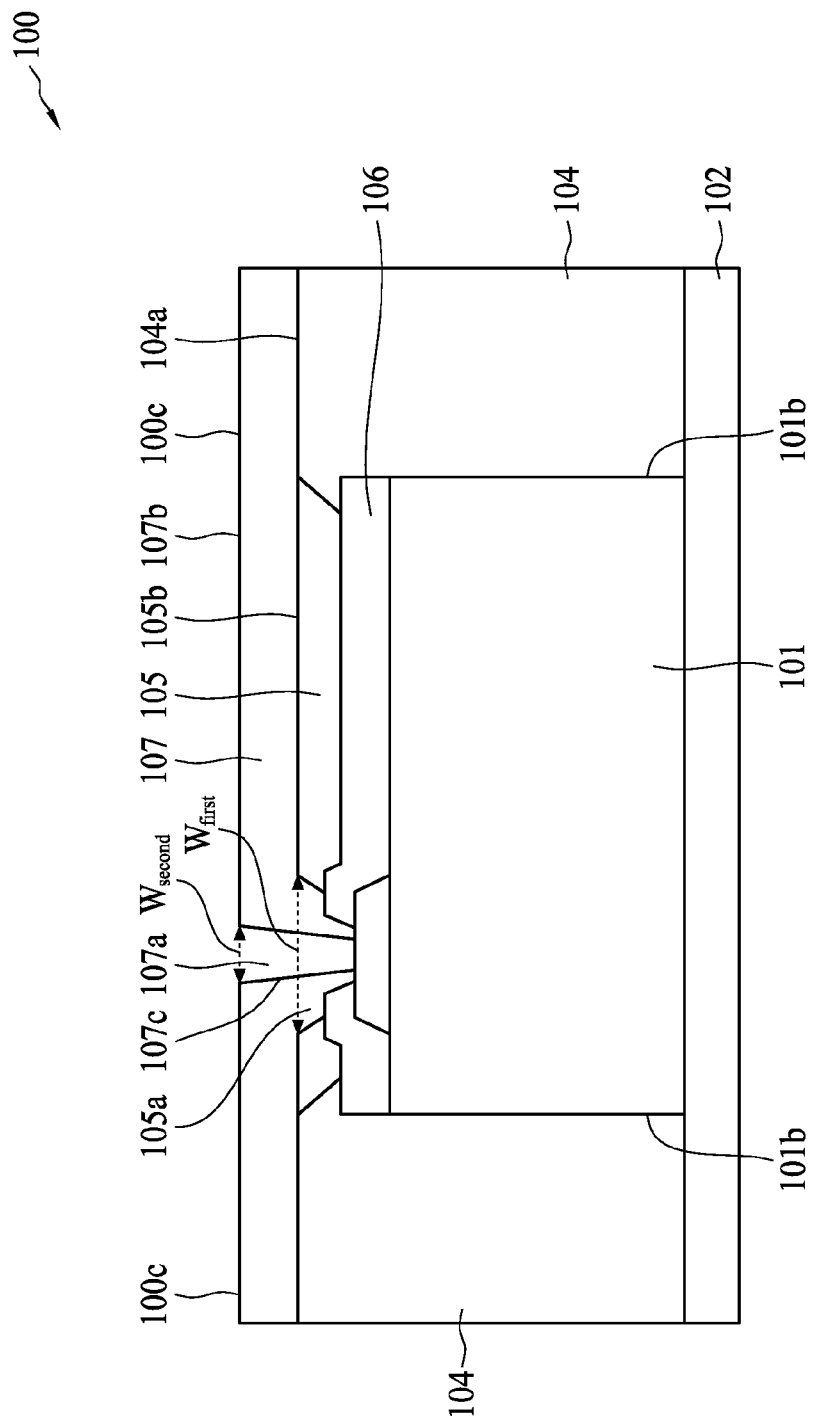
FIG. 5 is a schematic view of a semiconductor device with a second recessed portion of a second polymer in accordance with some embodiments of the present disclosure.

In some embodiments as in FIG. 5, the second polymer 107 includes a second recessed portion 107a. In some embodiments, the second recessed portion 107a is configured for receiving a conductive material such as the conductive trace so as to electrically connect the pad 103 with the circuitry external to the die 101 through the second recessed portion 107a.

In some embodiments, the second polymer 107 is patterned by several operations to form the second recessed portion 107a within the first recessed portion 105a adjacent to the pad 103. In some embodiments, the second polymer 107 is patterned by photolithography, that a photoresist material is disposed on the second polymer 107 to cover some of the second polymer 107 and the photoresist material is partially exposed through a photomask in order to etch away some of the second polymer 107 without coverage of the photoresist material, so that the second polymer 107 includes the second recessed portion 107a.

In some embodiments, the first recessed portion 105a of the first polymer 105 is larger than the second recessed portion 107a of the second polymer 107, so that the second recessed portion 107a is within the first recessed portion 105a. A sidewall 107c of the second recessed portion 107a covers the first recessed portion 105a. In some embodiments, the first recessed portion 105a of the first polymer 105 has a width $W_{first}$ of about 20 um to about 60 um. In some embodiments, the first recessed portion 105a of the first polymer 105 has a width $W_{first}$ of about 10 um to 80 um. In some embodiments, the second recessed portion 107a of the second polymer 107 has a width $W_{second}$ of about 10 um to 20 um. In some embodiments, the second recessed portion 107a of the second polymer 107 has a width $W_{second}$ of about 5 um to 30 um.

In some embodiments, the first recessed portion 105a of the first polymer 105 and the second recessed portion 107a of the second polymer 107 are in a tapered configuration. The first recessed portion 105a and the second recessed portion 107a are tapered towards the pad 103. The first recessed portion 105a is getting narrower from the top surface 105b towards the top surface 103a of the pad 103.

The second recessed portion 107a is getting narrower from the top surface 107b towards the top surface 103a of the pad 103.

Figure 6:
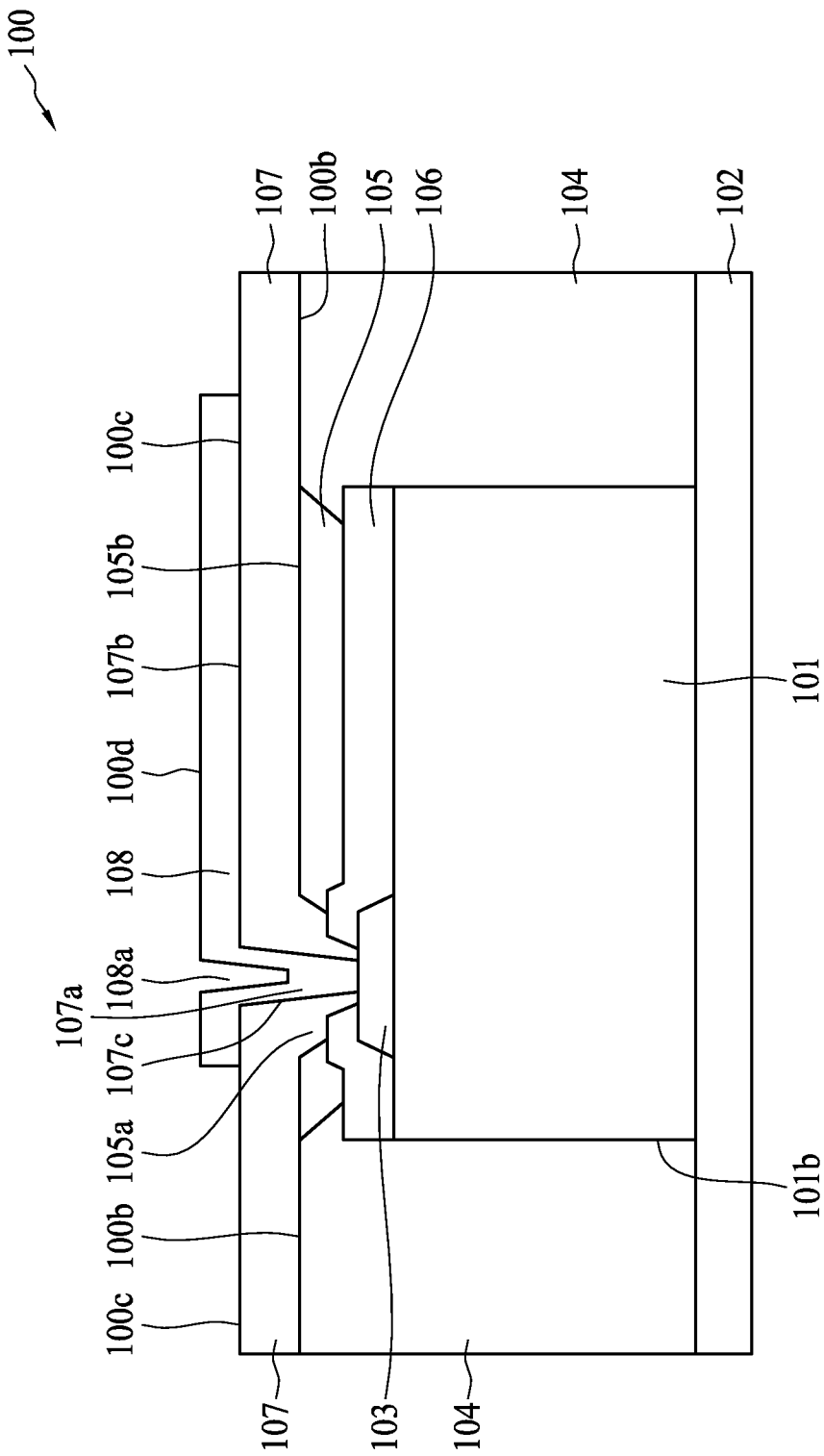
FIG. 6 is a schematic view of a semiconductor device with a conductive trace in accordance with some embodiments of the present disclosure.

In some embodiments as in FIG. 6, a conductive material 108 is disposed on the second polymer 107. The conductive material 108 is disposed within the second recessed portion 107a and on the top surface 107b of the second polymer 107. The conductive material 108 couples with the pad 103, so that the pad 103 can be electrically connected with the circuitry external to the die 101 through the conductive material 108.

In some embodiments, the conductive material 108 is disposed on the second polymer 107 along a second flat interface 100c in absence of stepping, stagger or tilting as in FIG. 6. In some embodiments, the first flat interface 100b between the first polymer 105, the molding 104 and the second polymer 107 is substantially parallel to the second flat interface 100c between the second polymer 107 and the conductive material 108.

In some embodiments, the conductive material 108 is configured with a third flat interface 100d substantially parallel to the first flat interface 100b and the second flat interface 100c. The third flat interface 100d is configured for receiving other components or materials of the semiconductor device 100 such as polymeric materials, dielectric materials, conductive materials, or etc. In some embodiments, the third flat interface 100d is a horizontally flattened surface which is absent from any stepping, stagger or tilting. In some embodiments, the conductive material 108 includes a third recessed portion 108a which is disposed within the first recessed portion 105a and the second recessed portion 107a.

In some embodiments, the conductive material 108 is a redistribution layer (RDL) 108. The RDL 108 is an electrical connection to and/or between the die 103 and the circuitry external to the die 101. The RDL 108 re-routes a path of a circuit from the pad 103 to the circuitry external to the die 101. In some embodiments, the conductive material 108 is pattern to act as an inductor. In some embodiments, the conductive material 108 includes a conductive material such as gold, silver, copper, nickel, tungsten, aluminum, and/or alloys thereof.

Figure 7:
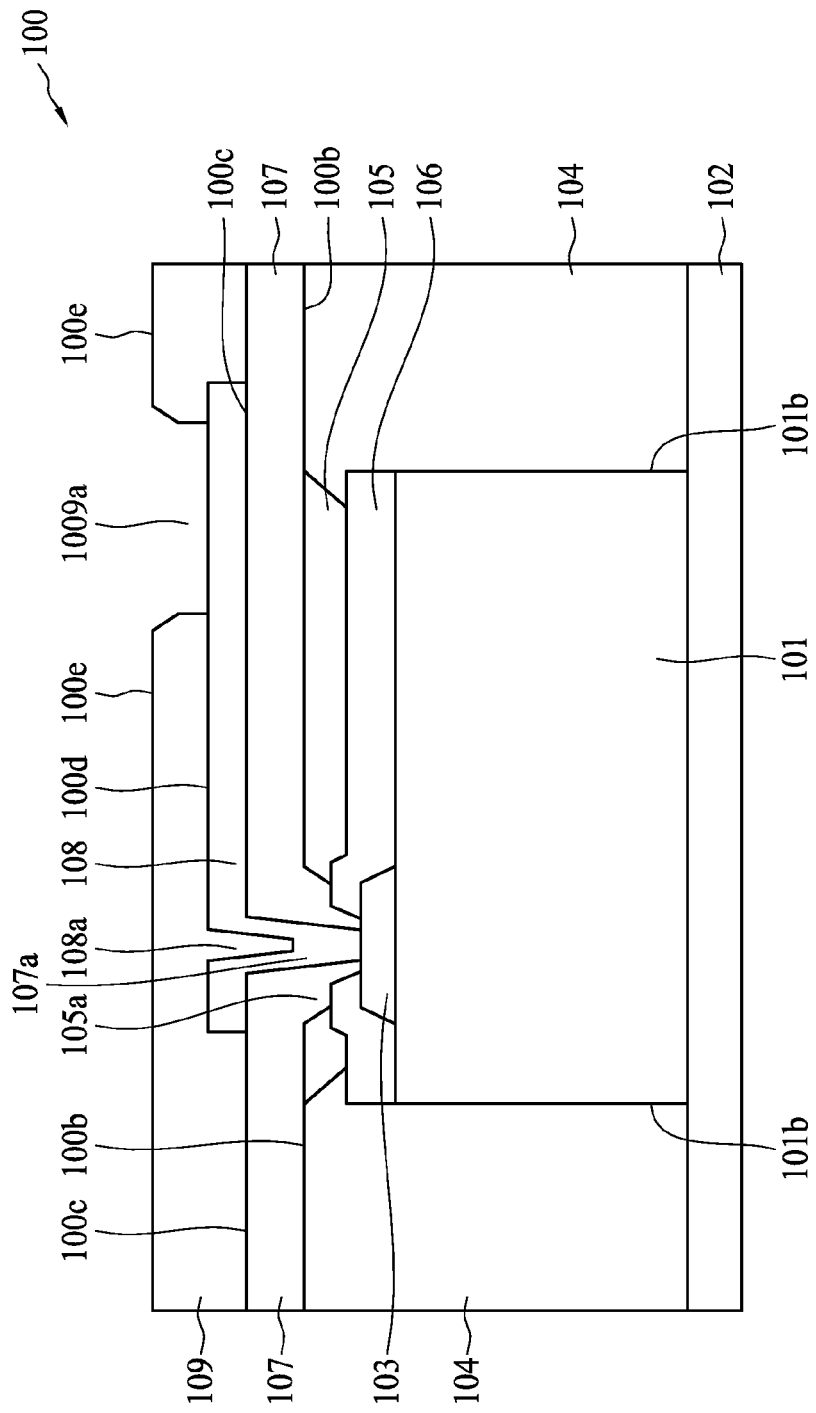
FIG. 7 is a schematic view of a semiconductor device with a third polymer in accordance with some embodiments of the present disclosure.

In some embodiments as in FIG. 7, a third polymer 109 is disposed on the conductive material 108 and the second polymer 107. The third polymer 109 runs horizontally from one side of the semiconductor device 100 to another opposite side of the semiconductor device 100 along the second flat interface 100c and the third flat interface 100d.

In some embodiments, the third polymer 109 is configured with a top surface 100e substantially parallel to the third flat interface 100d. In some embodiments, the third polymer 109 includes a fourth recessed portion 109a for receiving a conductive material such as copper or etc. In some embodiments, the third polymer 109 includes a polymeric material such as epoxy, polyimide, polybenzoxazole (PBO), solder resist (SR), ABF film, and the like.

Figure 8:
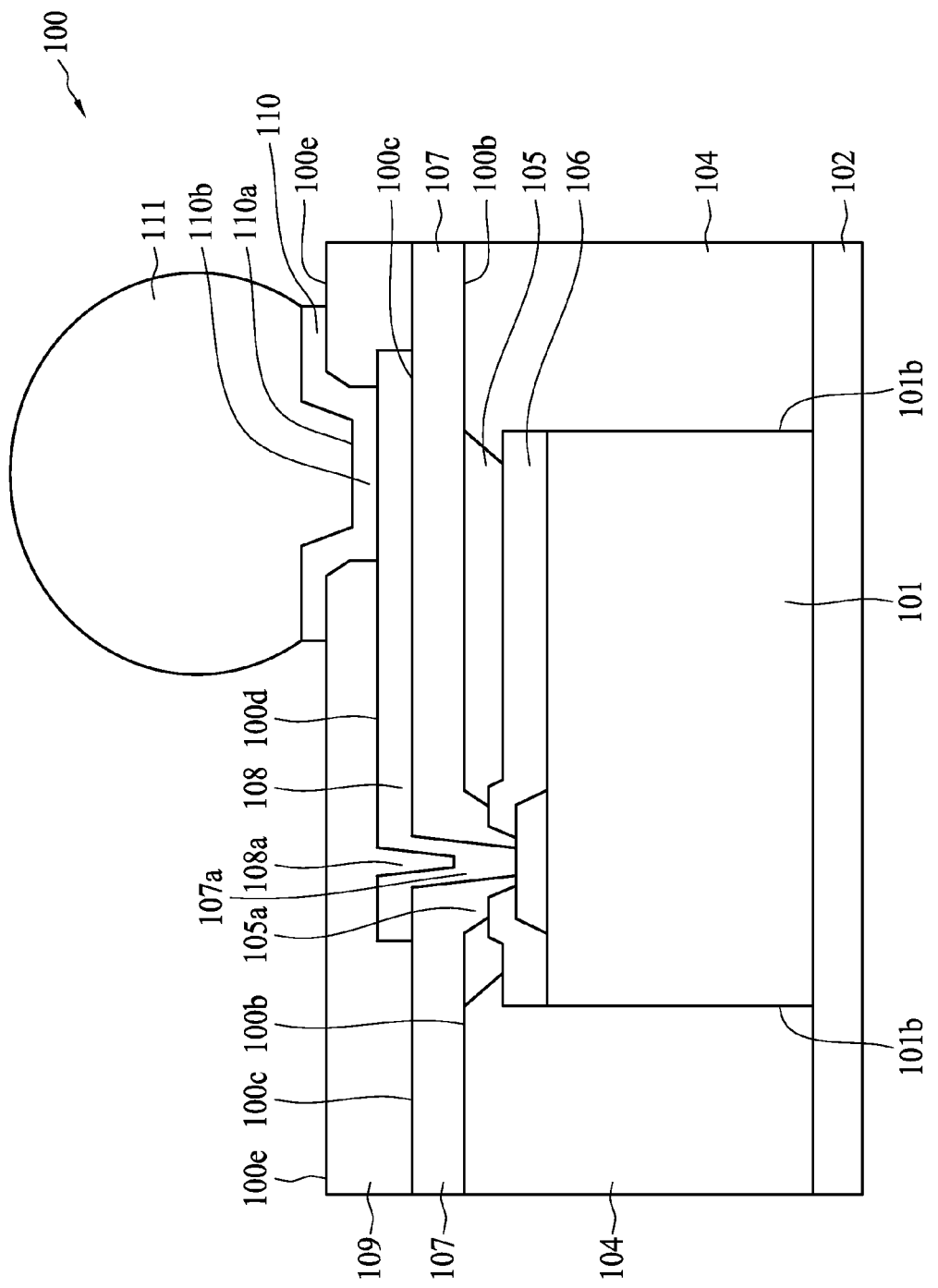
FIG. 8 is a schematic view of a semiconductor device with a bump on an under bump metallurgy (UBM) in accordance with some embodiments of the present disclosure.

In some embodiments, an under bump metallurgy (UBM) 110 is disposed on the conductive material 108 as in FIG. 8. In some embodiments, the UBM 110 is disposed on the third polymer 109 and the conductive material 108. The UBM 110 is disposed within the fourth recessed portion 109a (refer to FIG. 7) and on the top surface 100e of the third polymer 109. The UBM 110 is a solderable surface which is exposed for receiving a bump 111 and electrically connecting the pad 103 with the circuitry external to the die 101 through the conductive material 108 and the bump 111. In some embodiments, the bump 111 is a solder bump, solder ball, solder paste or etc. In some embodiments, the third flat interface 100d between the conductive material 108 and the UBM 110 is substantially parallel to the first flat interface 100b and the second flat interface 100c.

In some embodiments, the UBM 110 has a flat portion 110b which is substantially parallel to the third flat interface 100d and is horizontally disposed on the conductive material 108 as in FIG. 8. In some embodiments, the UBM 110 includes a fifth recessed portion 110a which is configured for receiving and attaching the bump 111 thereon. In some embodiments, the bump 111 is attached on the UBM 110 after heat treatment operations such as reflow.

Figure 9:
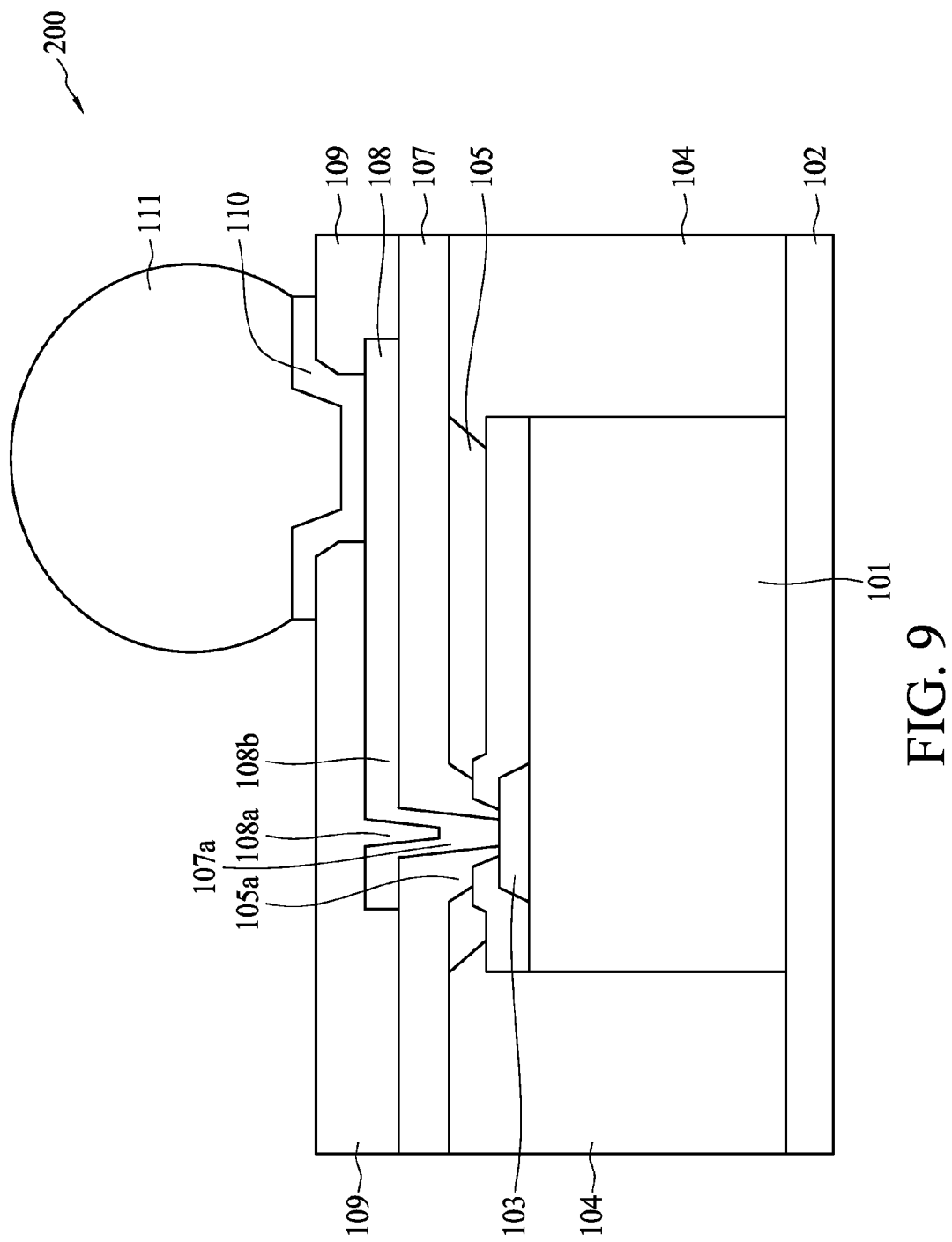
FIG. 9 is a schematic view of a semiconductor package in accordance with some embodiments of the present disclosure.

FIG. 9 is an embodiment of a semiconductor package 200. The semiconductor package includes a die 101 including a pad 103 disposed on top of the die 101 and coupled with interconnections in the die 101, a polymer 105 over the die 101 including a recessed portion 105a, a molding 104 surrounding the die 101 and the polymer 105, and a conductive trace 108 external to the die 101 and including a recessed portion 108a on the pad 103 and a flat portion 108b over the polymer 105. The recessed portion 108a of the conductive trace 108 is through the polymer 105 and in direct contact with the pad 103, the flat portion 108b is connected with the recessed portion 108a of the conductive trace 108 at one end, and is routed to electrically coupled with a bump 111 located at a level over a UBM 110, and is over the polymer 105.

In the present disclosure, a method of manufacturing a semiconductor device is also disclosed. In some embodiments, a semiconductor device is formed by a method 200. The method 200 includes a number of operations and the description and illustration are not deemed as a limitation as the sequence of the operations.

Figure 10:
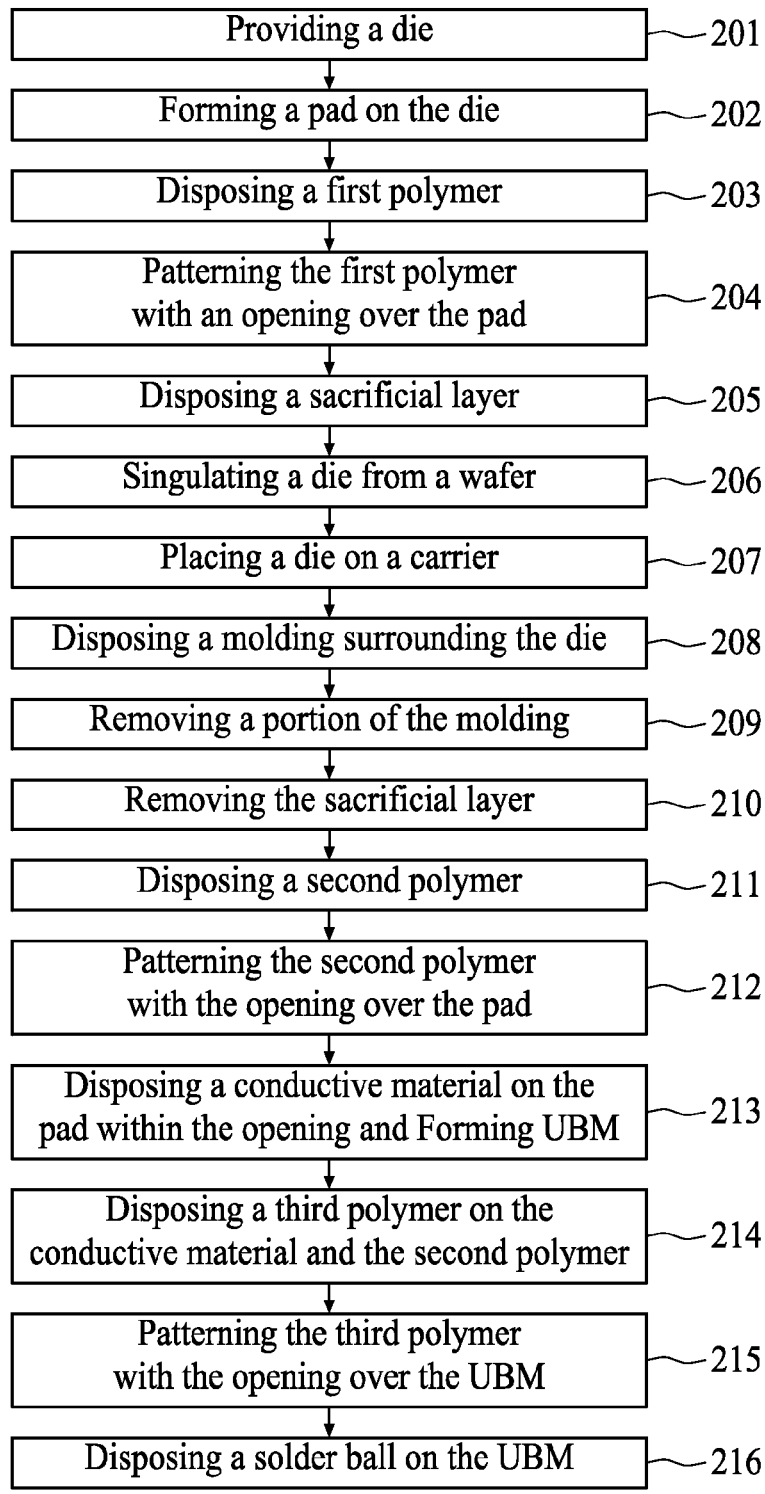
FIG. 10 is a flow diagram of a method of manufacturing a semiconductor device in accordance with some embodiments of the present disclosure.

FIG. 10 is an embodiment of a method 200 of manufacturing a semiconductor device. The method 200 includes a number of operations (201, 202, 203, 204, 205, 206, 207, 208, 209, 210, 211, 212, 213, 214, 215, 216).

Figure 10A:
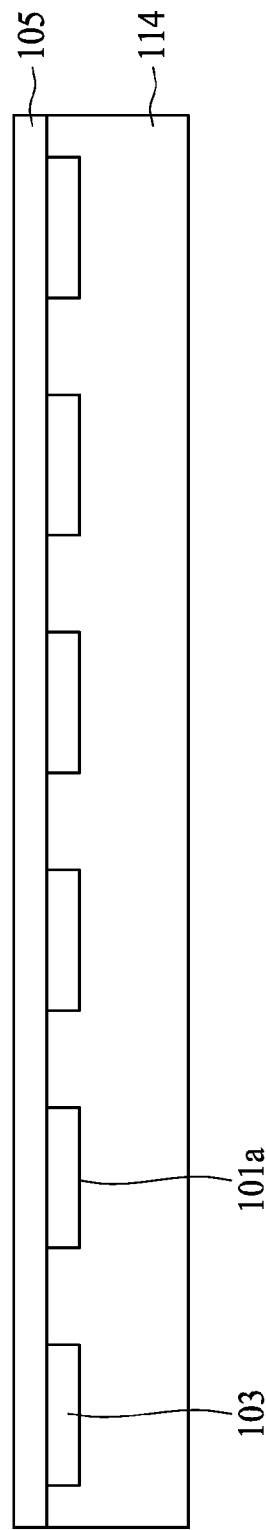
FIG. 10A is a schematic view of a wafer with a die, a pad and a first polymer in accordance with some embodiments of the present disclosure.

In operation 201, a wafer 114 is provided as in FIG. 10A. In some embodiments, the wafer 114 is formed by a semiconductor material such as silicon. In operation 202, a pad 103 is formed on the wafer 114 as in FIG. 10A. In some embodiments, the pad 103 is disposed on a surface of the wafer 114.

In operation 203, a first polymer 105 is disposed on the wafer 114 as in FIG. 10A. In some embodiments, the first polymer 105 is disposed on the pad 103 to cover the surface of the wafer 114.

Figure 10B:
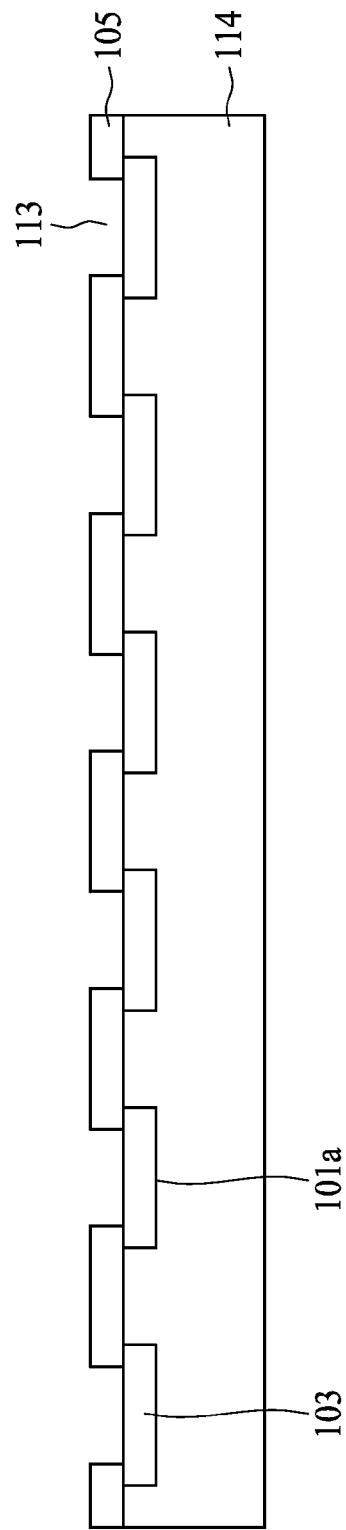
FIG. 10B is a schematic view of a wafer with a patterned first polymer in accordance with some embodiments of the present disclosure.

In operation 204, the first polymer 105 is patterned with an opening 113 above the pad 103 as in FIG. 10B. The first polymer 105 is patterned to provide a path for a conductive material or conductive trace passing through. In some embodiments, the first polymer 105 is patterned to form the opening 113 by photolithography. A photoresist material is disposed on the polymer 105 to cover the first polymer 105, and then the photoresist material is partially exposed through a photomask in order to etch away those first polymer 105 adjacent to the pad 103, so that the opening 113 is formed above the pad 103.

Figure 10C:
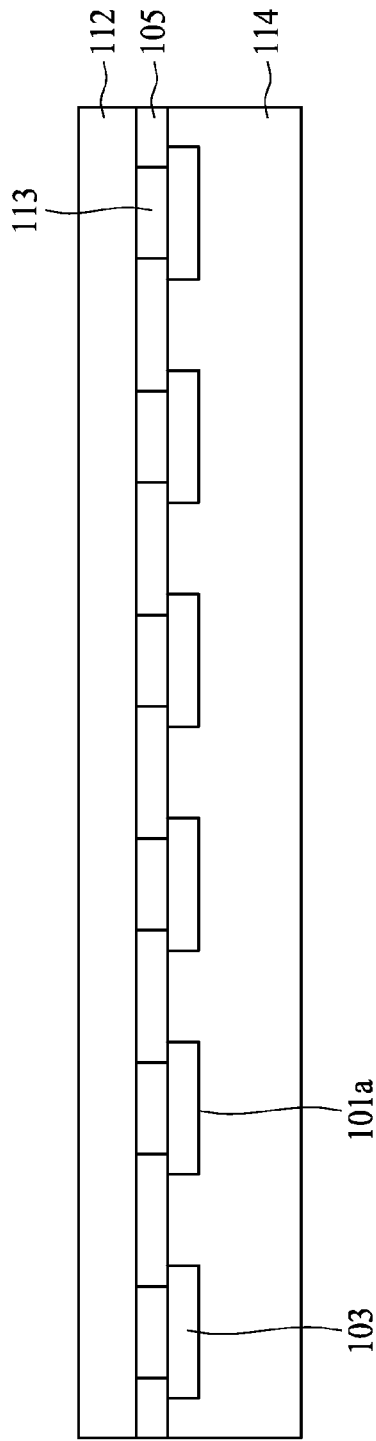
FIG. 10C is a schematic view of a wafer with a sacrificial layer in accordance with some embodiments of the present disclosure.

In operation 205, a sacrificial layer 112 is disposed over the patterned first polymer 105 as in FIG. 10C. In some embodiments, the sacrificial layer 112 is disposed on the patterned first polymer 105 to cover the first polymer 105 and the opening 113. In some embodiments, the sacrificial layer 112 includes a polymeric material such as such as epoxy, polyimide, polybenzoxazole (PBO), solder resist (SR), ABF film, and the like.

Figure 10D:
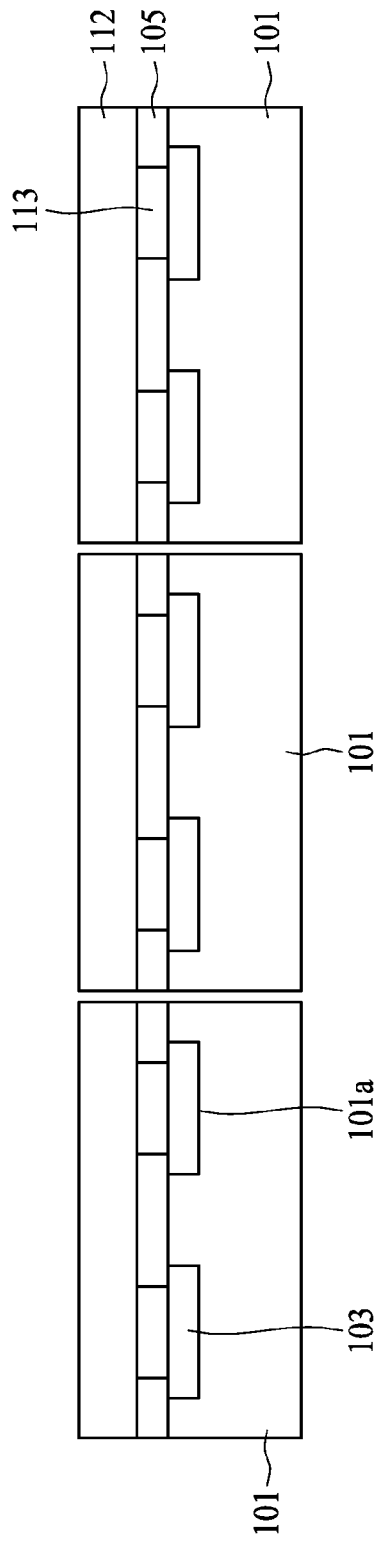
FIG. 10D is a schematic view of a wafer with singulated die in accordance with some embodiments of the present disclosure.
Figure 10E:
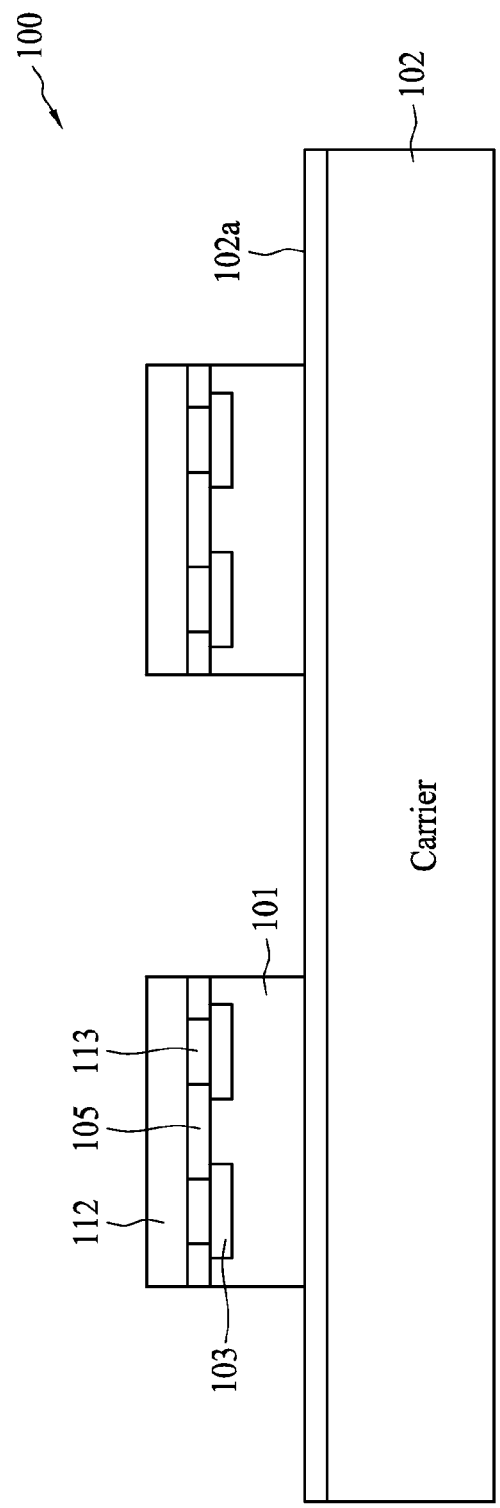
FIG. 10E is a schematic view of a semiconductor device with a die on a carrier in accordance with some embodiments of the present disclosure.

In operation 206, the wafer 114 is singulated into several individual dies 101 as in FIG. 10D. In some embodiments, the wafer 114 is singulated by a mechanical or laser blade. In operation 207, the die 101 singulated from the wafer 114 is placed on a carrier 102 as in FIG. 10E. The die 101 is disposed on a surface 102a of the carrier 102.

Figure 10F:
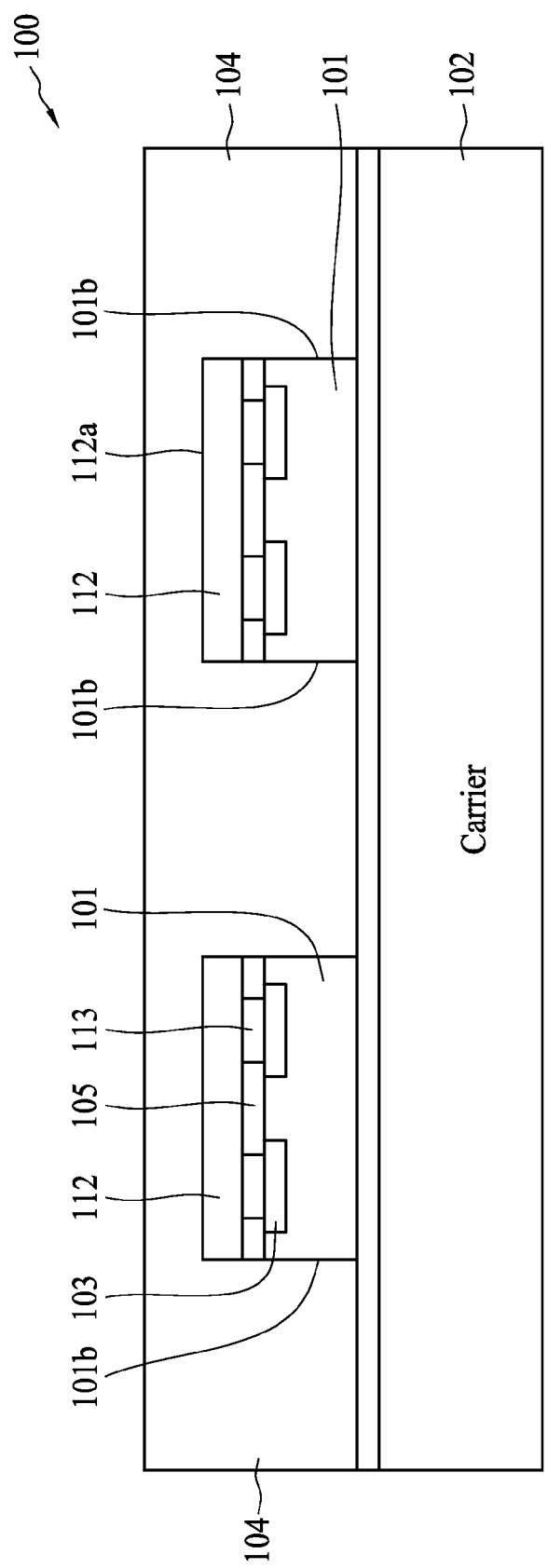
FIG. 10F is a schematic view of a semiconductor device with a molding compound in accordance with some embodiments of the present disclosure.

In operation 208, a molding 104 is disposed on the carrier 102 to surround the die 101 as in FIG. 10F. The molding 104 encapsulates the die 101. The molding 104 is disposed on a surface 102a of the carrier 102, a surface 112a of the sacrificial layer 112 and a sidewall 101b of the die 101. The molding 104 covers the die 101 in order to protect the die 101 from damages and isolate the die 101 from an ambient environment. In some embodiments, the molding 104 is made from a molding compound or a plastic material. In some embodiments, the molding compound fills the surrounding of the die 101 and then is cured by a heat treatment so as to solidify the molding compound to become the molding 104 encapsulating the die 101.

Figure 10G:
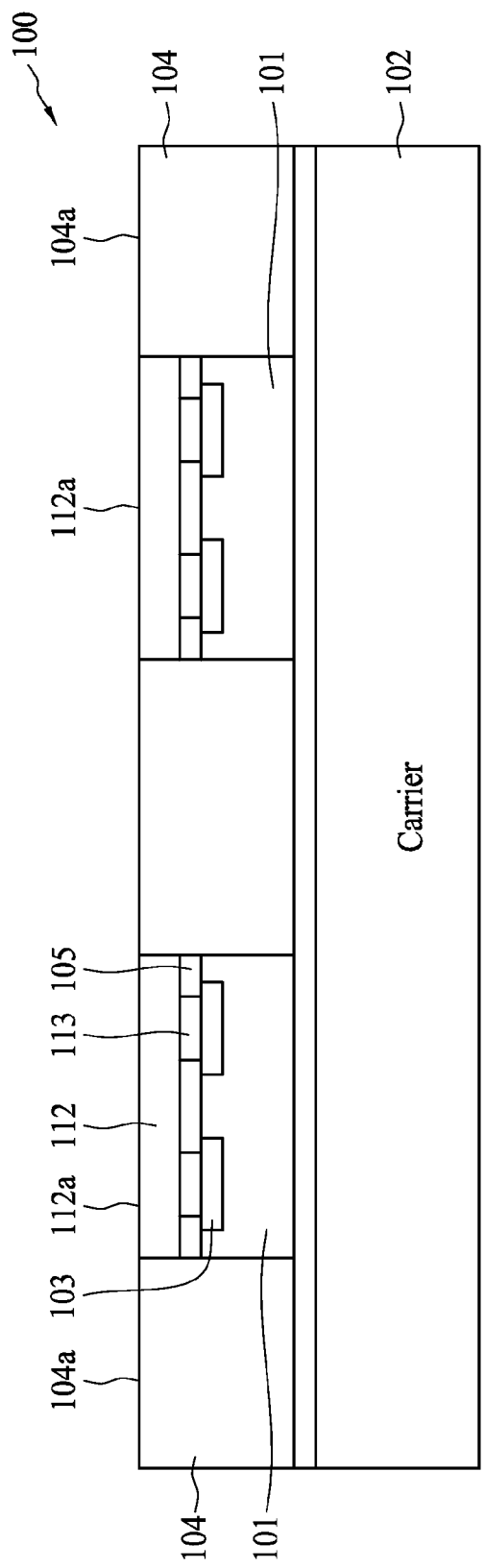
FIG. 10G is a schematic view of a semiconductor device with an exposed sacrificial layer in accordance with some embodiments of the present disclosure.

In operation 209, a top portion of the molding 104 is removed thereby exposing the sacrificial layer 112 as in FIG. 10G. In some embodiments, the top portion of the molding 104 is removed by operations such as etching or grinding. The top portion of the molding 104 is removed from the top of the molding 104 towards the die 101 along a vertical direction until the sacrificial layer 112 is reached, so that a top surface 112a of the sacrificial layer 112 is exposed. In some embodiments, the molding 104 is ground until the top surface 112a of the sacrificial layer 112 is exposed and is substantially in a same level as a top surface 104a of the molding 104. In some embodiments, the sacrificial layer 112 is configured to protect the first polymer 105 from damage during grinding.

Figure 10H:
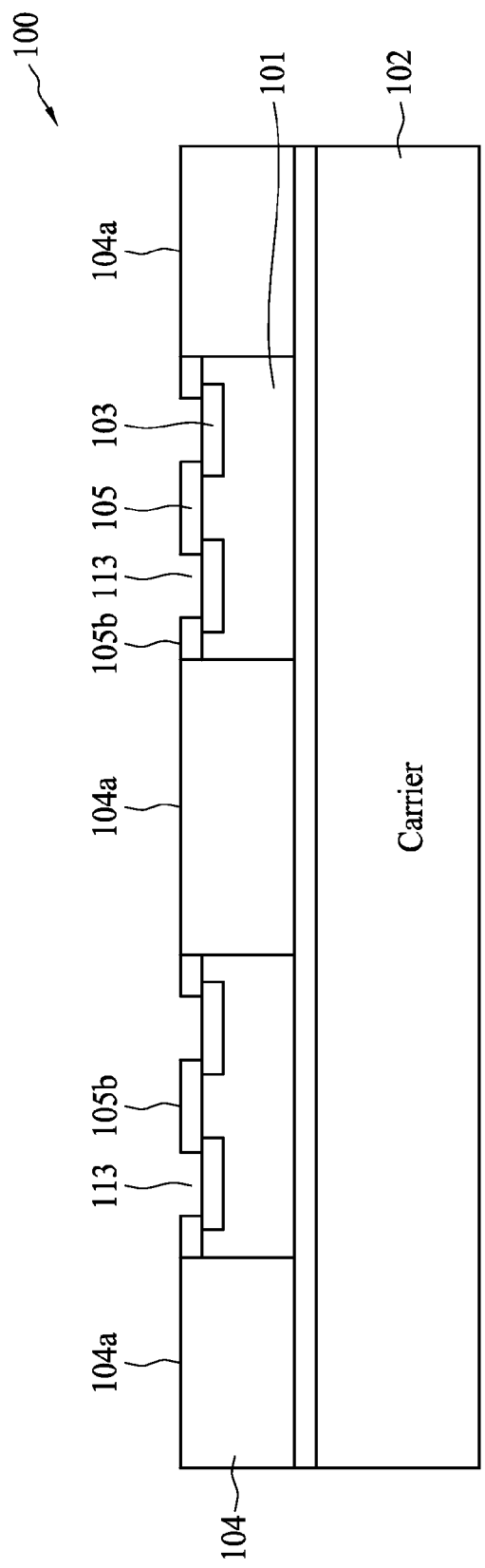
FIG. 10H is a schematic view of a semiconductor device with an exposed first polymer in accordance with some embodiments of the present disclosure.

In operation 210, the sacrificial layer 112 is removed thereby exposing the pad 103 and the first polymer 105 as in FIG. 10H. In some embodiments, the sacrificial layer 112 is removed by etching operations. A top surface 105b of the first polymer 105 is exposed and the pad 103 is exposed through the opening 113. In some embodiments, the sacrificial layer 112 is etched away and the top portion of the molding 104 is further ground towards the die 101. In some embodiments, the molding 104 is ground until the top surface 104a of the molding 104 is substantially in a same level as the top surface 105b of the first polymer 105.

Figure 10I:
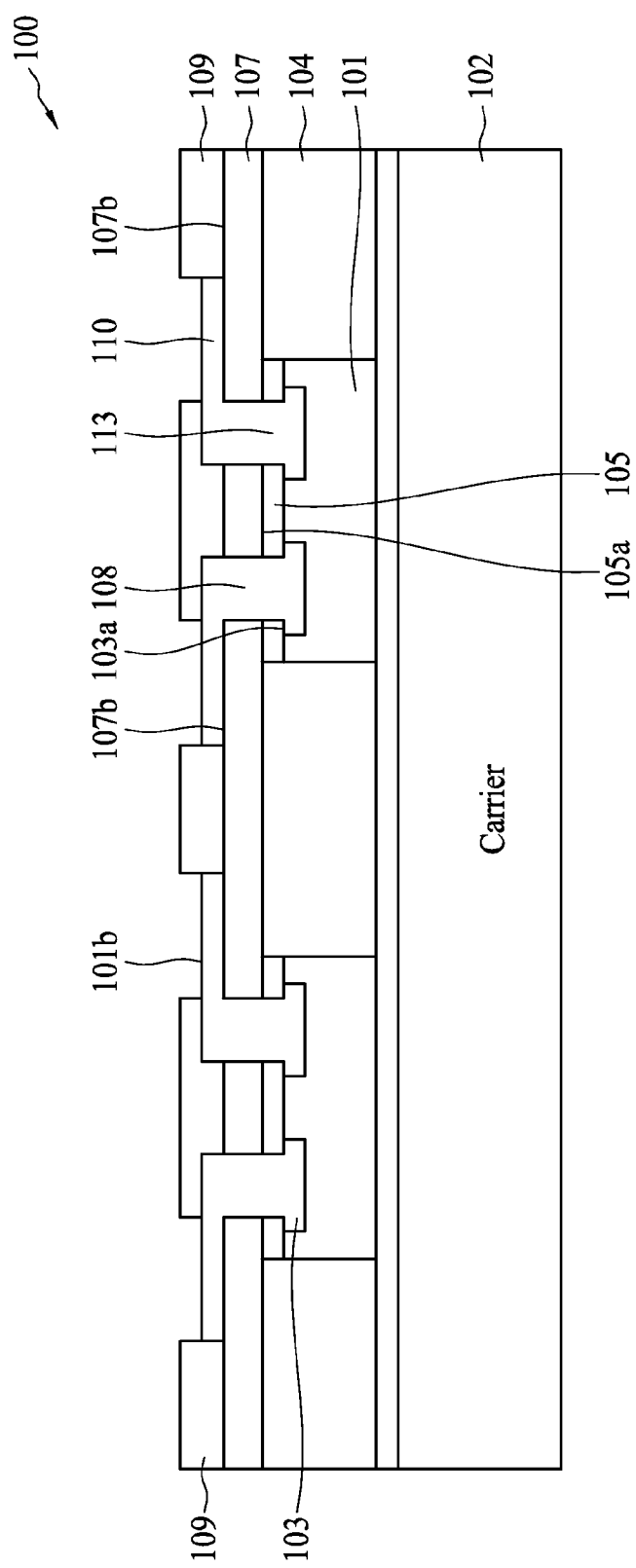
FIG. 10I is a schematic view of a semiconductor device with a conductive material, a second polymer and a third polymer in accordance with some embodiments of the present disclosure.

In operation 211, a second polymer 107 is disposed on the first polymer 105 as in FIG. 10I. In some embodiments, the second polymer 107 is disposed over the die 101 and is on the top surface 105b of the first polymer 105 and the top surface 104a of the molding 104.

In operation 212, the second polymer 107 is patterned with the opening 113 above the pad 103 as in FIG. 10I. In some embodiments, the second polymer 107 adjacent to the opening 113 above the pad 103 is removed by etching operations, so that the second polymer 107 is patterned with the opening 113 above the pad 103. The pad 103 is exposed through the opening 113 from the first polymer 105 to the second polymer 107.

In operation 213, a conductive material 108 is disposed on the pad 103 within the opening 113 to form a UBM 110 as in FIG. 10I. In some embodiments, the conductive material 108 fills the opening 113, disposes on the top surface 103a of the pad 103 and the second polymer 107 and extends along a portion of a top surface 107b of the second polymer 107 to form the UBM 110. In some embodiments, the conductive material 108 is a conductive trace for electrically connecting the pad 103 and the UBM 110 through the opening 113. In some embodiments, the conductive material 108 is a redistribution layer (RDL) for re-route a path of a circuitry from the pad 103 to the circuitry external to the die

101. In some embodiments, the UBM 110 is configured for receiving a bump on a flat portion 110b of the UBM 110. The flat portion 110b of the UBM 110 is exposed for receiving the bump.

In operation 214, a third polymer 109 is disposed on the conductive material 108 and the second polymer 107 as in FIG. 10I. The third polymer 109 covers the second polymer 107 and the conductive material 108. In operation 215, the third polymer 109 is patterned with the opening 113 above the UBM 110 as in FIG. 10I. In some embodiments, the third polymer 109 adjacent to the UBM is removed by etching operations, so that the third polymer 109 is patterned with the opening 113 above the UBM 110, as such the UBM 110 is exposed for receiving the bump.

Figure 10J:
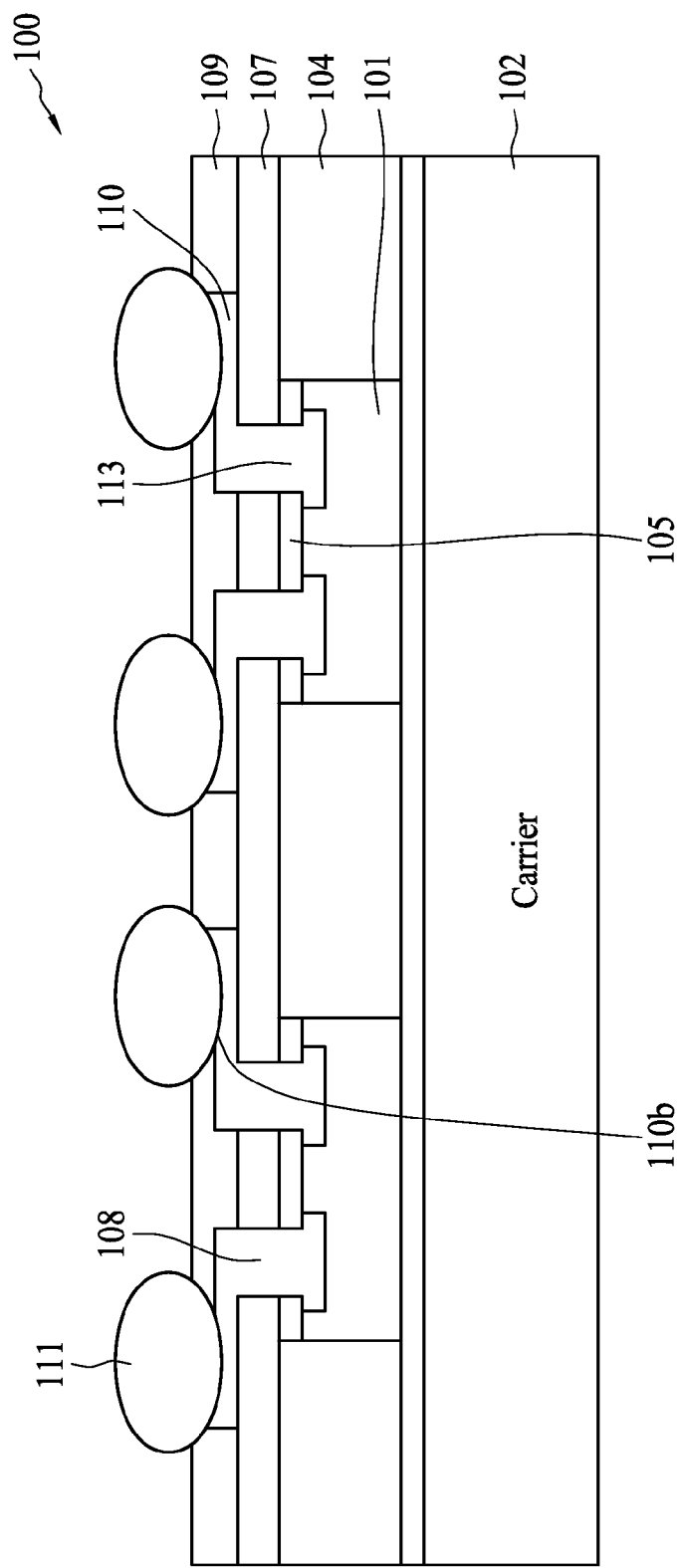
FIG. 10J is a schematic view of a semiconductor device with a bump in accordance with some embodiments of the present disclosure.

In operation 216, the bump 111 is disposed on the UBM 110 as in FIG. 10J. The bump 111 is attached on the flat portion 110b of the UBM 110, so that the pad 103 is electrically connected with the bump 111 through the conductive material 108 from the die 101 to the external circuitry. In some embodiments, the bump 111 is configured for bonding on a bond pad of the external circuitry within a printed circuit board (PCB), so that the semiconductor device 100 is bonded on the PCB, as such the circuitry of the die is electrically connected with the external circuitry of the PCB.

In some embodiments, a semiconductor device includes a die, a pad disposed on the die and configured to be electrically coupled with a bump through a conductive trace attached on the pad, a polymer disposed over the die and patterned to provide a path for the conductive trace passing through, and a molding surrounding the die and the polymer. A top surface of the molding is substantially in a same level as a top surface of the polymer. In some embodiments, the molding includes a protruded portion adjacent to an edge of the die and disposed between the polymer and the die. In some embodiments, the protruded portion of the molding has a height substantially the same as a thickness of the first polymer. In some embodiments, the height of the protruded portion of the molding is about 1 um to about 15 um. In some embodiments, a length of the protruded portion of the molding extended from the edge of the die towards the polymer is about 5 um to about 15 um. In some embodiments, an angled interface between the polymer and the protruded portion of the molding is in an angle about 30 degrees to about 110 degrees. In some embodiments, a passivation over the die and the pad. In some embodiments, the molding includes an extended portion adjacent to an edge of the die and disposed between the passivation and the die. In some embodiments, the extended portion of the molding extended from the edge of the die towards the passivation is about 2 um to about 6 um.

In some embodiments, a semiconductor device includes a die, a pad disposed on the die and configured to be electrically coupled with a bump through a conductive trace attached on the pad, a polymer disposed over the die and patterned to provide a path for the conductive trace passing through, a molding surrounding the die and the polymer; wherein a top surface of the molding is substantially in a same level as a top surface of the polymer. In some embodiments, the molding includes a protruded portion adjacent to an edge of the die and disposed between the polymer and the die. In some embodiments, the protruded portion of the molding has a height substantially the same as a thickness of the first polymer. In some embodiments, the height of the protruded portion of the molding is about 1 um to about 15 um. In some embodiments, a length of the protruded portion of the molding extended from the edge of the die towards the polymer is about 5 um to about 15 um. In some embodiments, an angled interface between the polymer and the protruded portion of the molding is in an angle about 30 degrees to about 110 degrees. In some embodiments, the semiconductor device further includes a passivation over the die and the pad. In some embodiments, the molding includes an extended portion adjacent to an edge of the die and disposed between the passivation and the die. In some embodiments, the extended portion of the molding extended from the edge of the die towards the passivation is about 2 um to about 6 um.

In some embodiments, a semiconductor device includes a die, a pad disposed on the die and electrically coupled with a bump through a conductive material attached on the pad, a first polymer disposed over the die and patterned with an opening over the pad for the conductive material passing through, a molding surrounding the die and the first polymer, a second polymer disposed between the conductive material, the first polymer and the molding, the first polymer includes a first recessed portion over the pad, and the second polymer includes a second recessed portion over the pad, the first recessed portion surrounding the second recessed portion. In some embodiments, the first recessed portion of the first polymer is larger than the second recessed portion of the second polymer. In some embodiments, the first recessed portion of the first polymer has a width of about 20 um to about 60 um. In some embodiments, the second recessed portion of the second polymer has a width of about 10 um to about 20 um. In some embodiments, the first recessed portion of the first polymer or the second recessed portion of the second polymer is in a tapered configuration. In some embodiments, a first flat interface between the first polymer, the molding and the second polymer is substantially parallel to a second flat interface between the second polymer and the conductive material. In some embodiments, the semiconductor further includes an under bump metallurgy (UBM) disposed on the conductive material. In some embodiments, a third flat interface between the conductive material and the UBM is substantially parallel to the first flat interface and the second flat interface.

In some embodiments, a method of manufacturing a semiconductor device includes providing a die, forming a pad on the die, disposing a first polymer over the die, patterning the first polymer with an opening over the pad, disposing a sacrificial layer over the patterned first polymer, disposing a molding surrounding the die, removing a portion of the molding thereby exposing the sacrificial layer, removing the sacrificial layer thereby exposing the pad and the first polymer, disposing a second polymer on the first polymer, patterning the second polymer with the opening over the pad, and disposing a conductive material on the pad within the opening. In some embodiments, the patterning the first polymer is performed by photolithography operations. In some embodiments, the removing the sacrificial layer is performed by etching operations.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A semiconductor device, comprising:
    a die;
    a pad disposed on the die and configured to be electrically coupled with a bump through a conductive trace attached on the pad;
    a passivation disposed over the die and a portion of the pad;
    a polymer disposed over the passivation and patterned to provide a path for the conductive trace passing through;
    a molding surrounding the die and the polymer,
    wherein a top surface of the molding is substantially in a same level as a top surface of the polymer, and the molding includes a protruded portion disposed over a top surface of the passivation.

2. The semiconductor device of claim 1, wherein the protruded portion is adjacent to an edge of the die and disposed between the polymer and the die.

3. A semiconductor device, comprising:
    a die;
    a pad disposed on the die and configured to be electrically coupled with a bump through a conductive trace attached on the pad;
    a polymer disposed over the die and patterned to provide a path for the conductive trace passing through;
    a molding surrounding the die and the polymer,
    wherein a top surface of the molding is substantially in a same level as a top surface of the polymer, and the molding includes a protruded portion adjacent to an edge of the die and disposed between the polymer and the die, and the protruded portion of the molding has a height substantially the same as a thickness of the polymer.

4. The semiconductor device of claim 3, wherein the height of the protruded portion of the molding is about 1 um to about 15 um.

5. The semiconductor device of claim 3, wherein a length of the protruded portion of the molding extended from the edge of the die towards the polymer is about 5 um to about 15 um.

6. The semiconductor device of claim 3, wherein an angled interface between the polymer and the protruded portion of the molding is in an angle about 30 degrees to about 110 degrees.

7. The semiconductor device of claim 3, further comprising a passivation over the die and the pad.

8. The semiconductor device of claim 7, wherein the molding includes an extended portion adjacent to an edge of the die and disposed between the passivation and the die.

9. The semiconductor device of claim 8, wherein the extended portion of the molding extended from the edge of the die towards the passivation is about 2 um to about 6 um.

10. The semiconductor device of claim 3, wherein the top surface of the molding and the top surface of the polymer are in cooperation to configure as a flat interface for receiving a component or a material.

11. The semiconductor device of claim 3, wherein the top surface of the molding and the top surface of the polymer are configured as a horizontally flattened surface running along a horizontal plane from one side of the semiconductor device to an opposite side of the semiconductor device.

12. A semiconductor device, comprising:
    a die;
    a pad disposed on the die and electrically coupled with a bump through a conductive material attached on the pad;
    a first polymer disposed over the die and patterned with an opening over the pad for the conductive material passing through;
    a molding surrounding the die and the first polymer;
    a second polymer disposed between the conductive material, the first polymer and the molding, wherein
    the first polymer includes a first recessed portion over the pad, and
    the second polymer includes a second recessed portion over the pad, and
    the first recessed portion surrounding the second recessed portion, and
    a first flat interface between the first polymer, the molding and the second polymer is substantially parallel to a second flat interface between the second polymer and the conductive material.

13. The semiconductor device of claim 12, wherein the first recessed portion of the first polymer is larger than the second recessed portion of the second polymer.

14. The semiconductor device of claim 12, wherein the first recessed portion of the first polymer has a width of about 20 um to about 60 um.

15. The semiconductor device of claim 12, wherein the second recessed portion of the second polymer has a width of about 10 um to about 20 um.

16. The semiconductor device of claim 12, wherein the first recessed portion of the first polymer or the second recessed portion of the second polymer is in a tapered configuration.

17. The semiconductor device of claim 12, further comprising an under bump metallurgy (UBM) disposed on the conductive material.

18. The semiconductor device of claim 12, wherein a third flat interface between the conductive material and the UBM is substantially parallel to the first flat interface and the second flat interface.

19. The semiconductor device of claim 12, wherein the conductive material is disposed within the second recessed portion and a top surface of the second polymer.

* * * * *